United States Patent
Huang (10) Patent No.: US 8,171,848 B2
(45) Date of Patent: May 8, 2012

(54) MANUFACTURING METHOD OF PRINTING PLATE USING FREE-SEAL, FREE-QUANTITY LIQUID PHOTOPOLYMER SACHET AND APPARATUS USING THE SAME

(76) Inventor: Hilson Huang, Taipei Hsien (TW)

( * ) Notice: Subject to any disclaimer, the term of this patent is extended or adjusted under 35 U.S.C. 154(b) by 599 days.

(21) Appl. No.: 12/318,784

(22) Filed: Jan. 8, 2009

(65) Prior Publication Data

US 2009/0291394 A1    Nov. 26, 2009

(30) Foreign Application Priority Data

May 20, 2008    (TW) ................................ 97118494 A (51) Int. Cl.
*B41M 9/02* (2006.01)
*B41M 9/04* (2006.01)
*B41N 3/00* (2006.01)

(52) U.S. Cl. ..................................... 101/401.1; 430/300

(58) Field of Classification Search ............... 101/401.1; 430/300; *B41M 9/02, 9/04; B41N 3/00*
See application file for complete search history.

(56) References Cited

U.S. PATENT DOCUMENTS

| 4,216,287 A * | 8/1980 | Sano et al. ................. 430/271.1 |
| 2004/0219458 A1* | 11/2004 | Holt et al. ................. 430/281.1 |

FOREIGN PATENT DOCUMENTS

EP              607106 A1 *   7/1994

* cited by examiner

*Primary Examiner* — Judy Nguyen
*Assistant Examiner* — Jennifer Simmons
(74) *Attorney, Agent, or Firm* — C. G. Mersereau; Nikolai & Mersereau, P.A.

(57) ABSTRACT

This invention is related to a manufacturing method of a printing plate by using a free-seal, free-quantity liquid photopolymer sachet and an apparatus thereof. Using this technology, the liquid photopolymer sachet is no longer to be limited by quantity with 3 dimensions—width, length and thickness. It is now very free, easy and convenient to use liquid photopolymer resin in a bag to make a printing plate at any width and length with any thickness you want.

15 Claims, 7 Drawing Sheets

MANUFACTURING METHOD OF PRINTING PLATE USING FREE-SEAL, FREE-QUANTITY LIQUID PHOTOPOLYMER SACHET AND APPARATUS USING THE SAME

BACKGROUND OF THE INVENTION (1) Field of the Invention

The invention relates to a manufacturing method of a printing plate using a liquid photopolymer sachet and an apparatus using the same, and more particularly to a manufacturing method of a printing plate using a liquid photopolymer sachet, which can be freely sealed and freely quantified, to replace a conventional liquid photopolymer sachet, which has been completely sealed and contained the quantified liquid photopolymer.

(2) Description of the Prior Art

Figure 1:
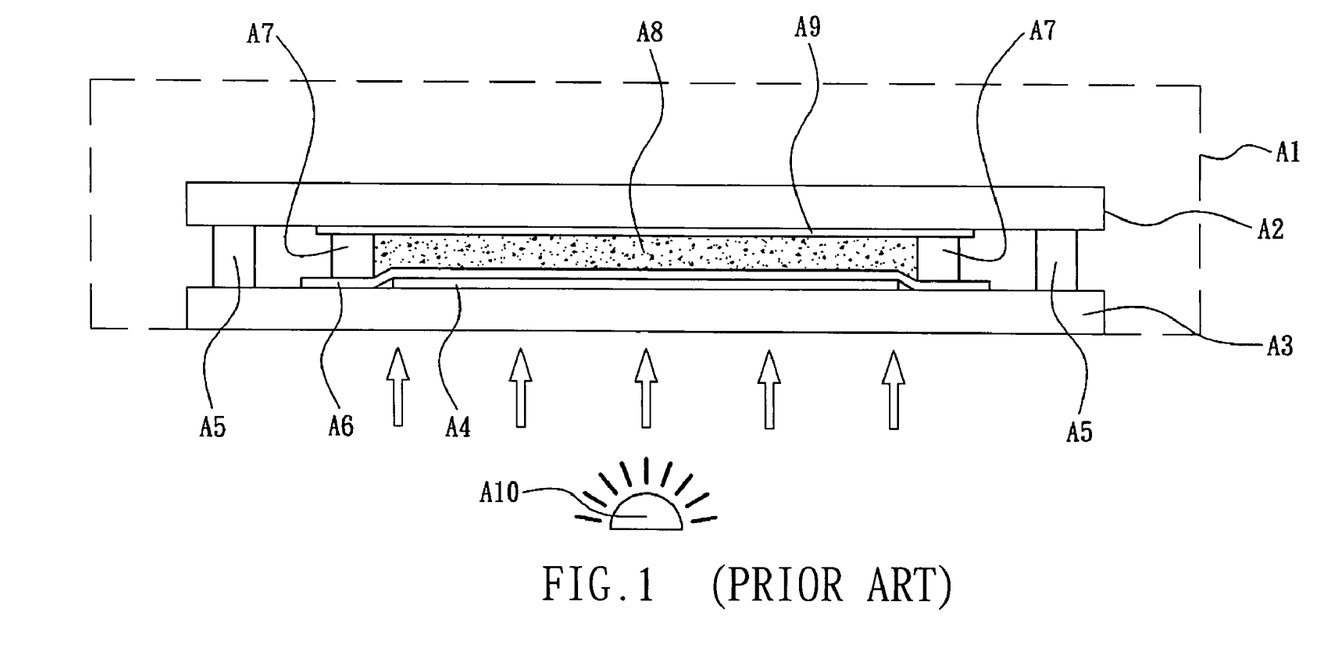
FIG. 1 is a schematic illustration showing an enlarged cross-sectional view of a structure, in which a liquid photopolymer is placed before an exposure procedure in a conventional non-precoating method for making a plate.
Figure 2:
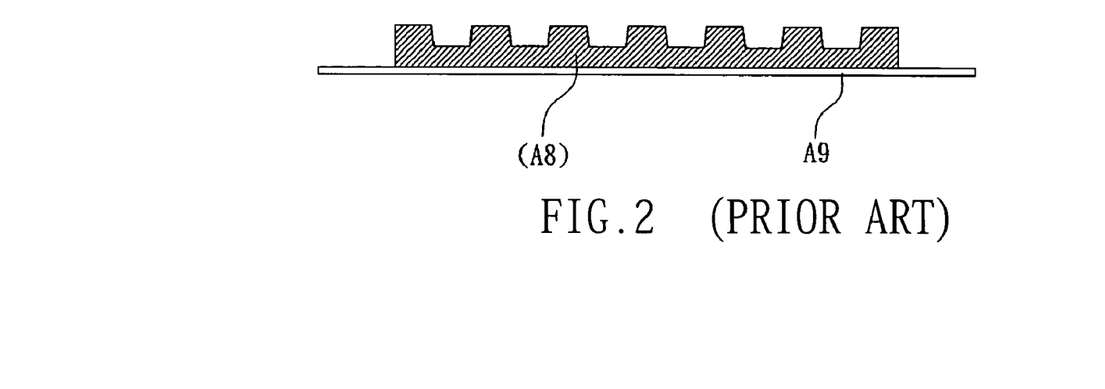
FIG. 2 is a schematically cross-sectional view showing a side surface of a printing plate finished in FIG. 1.

At present, the plate making methods of manufacturing a printing plate from a negative film includes a precoating method and a non-precoating method. The precoating method is to use a molded polymer plate, which has the fixed length, width and thickness, as a printing plate body, and a pattern the same as that of the negative film is formed on the polymer plate by way of exposing, washing and other procedures so that the printing plate is manufactured. In the non-precoating method, the molded polymer plate is not used, but a liquid photopolymer is used as an original material. In this method, the liquid photopolymer encloses a range having the fixed length, width and thickness, and then the exposure and harden procedures are performed so that the printing plate is formed after the washing procedure. The typical non-precoating method is performed in conjunction with an exposure machine. In addition, before the molding and exposing procedures are performed, the following steps are necessary. As shown in FIG. 1 in conjunction with the operation guide of the conventional exposure machine, a drawer A1 for exposure of the exposure machine is opened (pulled out). A clamping plate device composed of two pieces of transparent glass A2 and A3 is disposed in the drawer A1, wherein suction channels are typically provided in the sandwich layer of the clamping plate so that air can be sucked at a time simultaneously. Then, the upper glass A2 of the clamping plate is opened, a negative film A4 is placed on the lower glass A3, and supporting columns A5 are disposed at four corners. Next, a covering film A6 is placed on the negative film so that the liquid photopolymer is completely isolated from the negative film to protect it. Then, a close frame A7 is provided around the negative film using a rubber tape as a thickness gauge. Next, a quantified liquid photopolymer is poured into the frame A7. The liquid photopolymer is typically contained in a canned container, the poured quantity of the liquid photopolymer has to be properly controlled, and no bubble is allowed to be formed therein. If a bubble is formed, it must be removed. Thus, a uniform liquid photopolymer layer A8 having the suitable thickness can be formed. Then, a plastic film, such as a polyethelyne polyester, is applied to the surface of the liquid photopolymer layer A8 to serve as a base film A9. The plastic film has to be applied to the liquid photopolymer layer A8 from the middle portion to the outer edges very carefully in order to prevent the bubble from being generated between the base film A9 and the liquid photopolymer layer A8. Next, the upper glass A2 covers the lower glass A3 tightly so that the assembly of FIG. 1 is formed. Then, the drawer A1 is pushed into the exposure machine to perform the exposure procedure, in which a light source A10 illuminates the drawer A1 from the bottom to the top. After the exposure procedure, the printing plate having the base film A9 and the partly hardened photosensitive portion of the liquid photopolymer layer A8 is taken out, and a solvent or water is used to perform the washing procedure so that the printing plate having the base film A9 is formed, as shown in FIG. 2. However, the above-mentioned procedures are very complicated. In particularly, the quantity of the material of the liquid photopolymer layer A8 poured into the frame A7 has to be properly controlled, and the operator has to be very familiar with the technique to prevent the bubble from being generated, or otherwise the molding quality of the printing plate cannot be ensured. In addition, the liquid photopolymer in the opaque portion after the exposure procedure cannot be hardened and can be recycled. However, the liquid photopolymer in the above-mentioned procedure is placed in an open manner and thus cannot be easily collected. So, it is disadvantageous to the recycling operation and the environment protection purpose.

Figure 3:
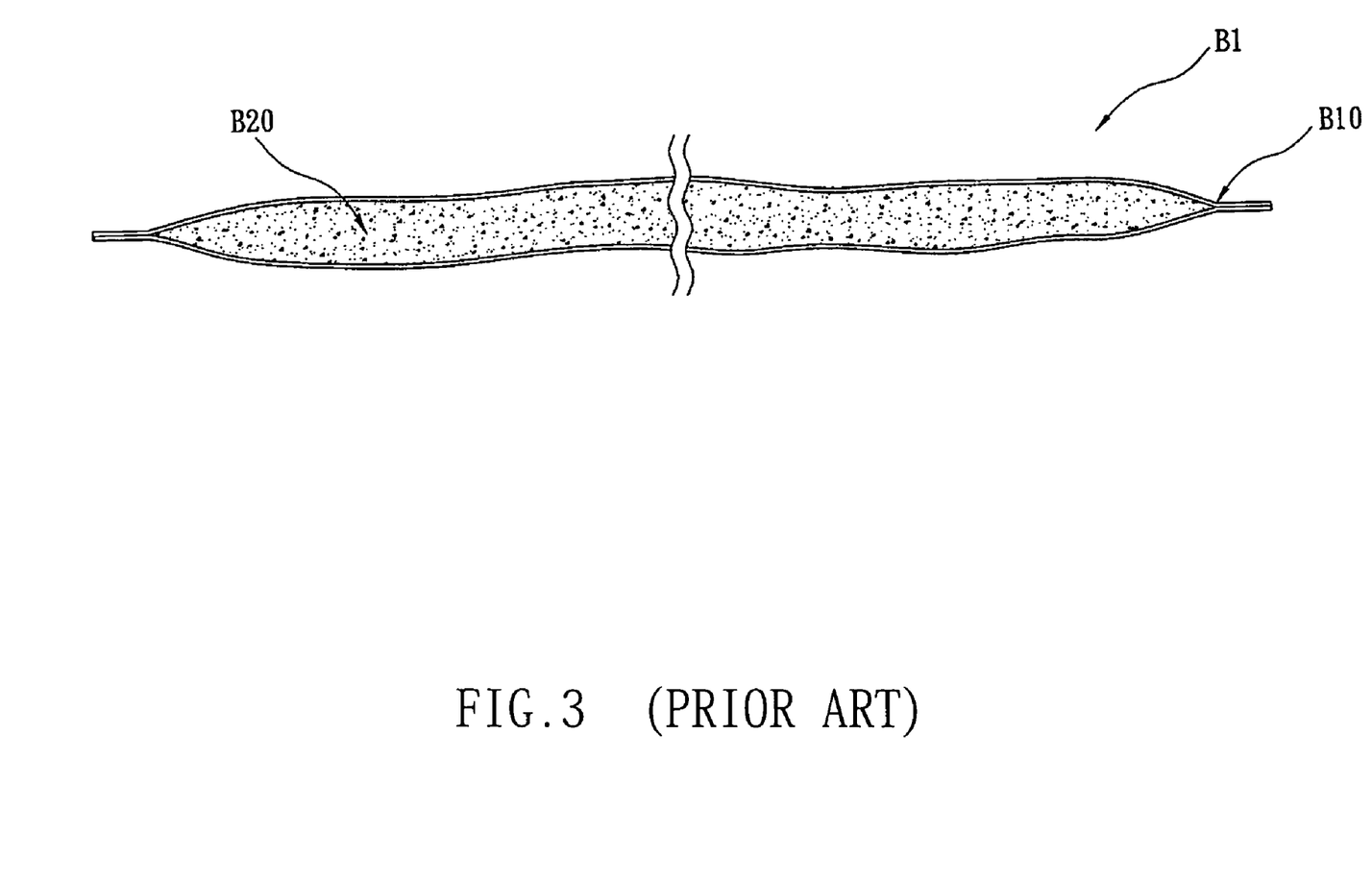
FIG. 3 is a schematic illustration showing an enlarged cross-sectional view of a structure, in which a liquid photopolymer sachet dedicated for printing and plate making is used in the conventional non-precoating method.

Also, the inventor has disclosed a liquid photopolymer sachet dedicated for the printing and plate making in a non-precoating method in Taiwan Patent Number M259927 in order to solve the drawback of the manufacturing method of the printing plate in the typical non-precoating method. In the M259927 patent, the technical report of the utility patent with the comparison result coded "6" is obtained, wherein a flat transparent sachet body B10 is used, as shown in FIG. 3, and a suitable quantity of liquid photopolymer B20 is contained in the thin sachet body according to the inner size of the thin sachet body. Thus, a closed liquid photopolymer sachet B1 is formed and can be directly placed into the clamping plate and flattened to form a liquid photopolymer structure layer as a printing plate body during the plating making procedure of the non-precoating method. However, the liquid photopolymer sachet B1 is a closed sachet body having the outer sachet body B10 being completely sealed, and the liquid photopolymer B20 contained therein has been completely quantified. That is, the liquid photopolymer sachet B1 is a completely sealed and quantified liquid photopolymer sachet. When the printing plate is to be manufactured, the liquid photopolymer sachet B1 having accurate quantity corresponding to the specifications (i.e., length, width and thickness) has to be selected or provided according to the printing plate so that the plate making procedure can be performed. However, the specification of the printing plate size and the thickness are in variations. Therefore, it is not so easy to prepare an accurate liquid photopolymer sachet B1 having the completely corresponding specifications, or many sachets have to be prepared in stock so that the plate maker may select a proper liquid photopolymer sachet B1. But if a bigger liquid photopolymer sachet B1 is selected, the liquid photopolymer is wasted. This invention is made based on the drawbacks of the conventional liquid photopolymer sachet B1.

SUMMARY OF THE INVENTION

The main object of the invention is to provide a manufacturing method of a printing plate using a liquid photopolymer sachet, which can be freely sealed and freely quantified, and an apparatus using the same. The liquid photopolymer sachet, which may be freely sealed and freely quantified, is provided according to the specifications (length, width and thickness) and in accordance with the quantity to a to-be-manufactured printing plate. The transparent sachet may have the non-restrictive shape and has at least one side, which is not sealed. The transparent sachet can be freely quantified so that the liquid photopolymer can be poured therein. The input quantity of the liquid photopolymer can be greater than the estimated quantity of the printing plate. Then, the transparent sachet is evenly placed on a lower transparent clamping plate, and a negative film to form printing image may be interposed between the transparent sachet and the lower transparent clamping plate. That is, the negative film is placed below the transparent sachet or above the transparent sachet. Thickness gauges are disposed around the transparent sachet body. The thickness of the gauge is equal to a sum of a predetermined thickness of the printing plate, a thickness of two layers of the transparent sachet and a thickness of the negative film. At least one thrust rod, which can roll or slide freely and has a diameter or height smaller than the thickness of the gauge, is provided to press against the liquid photopolymer transparent sachet in parallel to the side, which is not sealed, at a position distant from the side, which is not sealed, by a distance such that a stop end, which is movable relative to the liquid photopolymer contained in the liquid photopolymer transparent sachet, is formed to temporarily stop the liquid photopolymer. Thus, the liquid photopolymer contained in the liquid photopolymer transparent sachet is higher than the thickness gauge to prevent the liquid photopolymer from flowing to the side of the liquid photopolymer transparent sachet, which is not sealed. Then, an upper transparent clamping plate is provided to press against the lower transparent clamping plate evenly and thus to flatten the liquid photopolymer transparent sachet to a thickness the same as the thickness of the gauge. The liquid photopolymer, which is contained in the liquid photopolymer transparent sachet and higher than the thickness gauge, can freely flow to the side that is not sealed during the flattening, and push the thrust rod outwards until the thrust rod is stopped naturally so that the liquid photopolymer contained in the liquid photopolymer transparent sachet is formed into a uniform liquid photopolymer layer, which has a predetermined thickness and serves as a printing plate body. Then, subsequent exposure and hardening procedures are performed. Next, an exposed printing plate body is taken out of the transparent sachet after the exposure and hardening procedures are finished. Then, a washing procedure is performed to finish the printing plate. Thus, it is possible to avoid the drawbacks that the conventional method of manufacturing the printing plate using the liquid photopolymer sachet, which is completely sealed and quantified, and to simplify the manufacturing processes of the printing plate and the plate making apparatus so that the manufacturing cost and the apparatus cost of the printing plate can be reduced and the working efficiency of the plate making can be enhanced.

Still another object of the invention is to provide a manufacturing method of a printing plate using a liquid photopolymer sachet, which can be freely sealed and freely quantified, and an apparatus using the same. When the transparent sachet is evenly disposed on a lower transparent clamping plate and a negative film is interposed between the transparent sachet and the lower transparent clamping plate (i.e., disposed below the transparent sachet), suction channels can be provided to perform a vacuuming procedure so that the transparent sachet, the negative film and the lower transparent clamping plate can tightly contact with each other to prevent gaps from being formed therebetween. Thus, the image precision in the subsequent negative film exposure procedure may be enhanced.

Yet still another object of the invention is to provide a manufacturing method of a printing plate using a liquid photopolymer sachet, which can be freely sealed and freely quantified, and an apparatus using the same. When an upper transparent clamping plate is provided to evenly press against a lower transparent clamping plate, suction channels may be utilized to perform a vacuuming procedure again so that the upper transparent clamping plate can tightly contact with the transparent sachet to prevent gaps from being formed therebetween and from influencing the plate evenness of thickness. Then, an upper light source for the plate bottom exposure procedure is disposed above the upper transparent clamping plate to perform the plate bottom exposure procedure so that the exposure procedure of the liquid photopolymer is finished.

Yet still another object of the invention is to provide a manufacturing method of a printing plate using a liquid photopolymer sachet, which can be freely sealed and freely quantified, and an apparatus using the same. A transparent plastic film may be further provided to cover an upper surface of the transparent sachet so that the plastic film is interposed between upper and lower transparent clamping plates and has the function of air isolation. Thus, airtight upper and lower airtight spaces may be respectively formed between the plastic film and both the lower transparent clamping plate and the upper transparent clamping plate. When vacuuming procedures are performed in the upper and lower airtight spaces using suction channels, the upper and lower transparent clamping plates may tightly contact with the transparent sachet and the negative film to prevent gaps from been formed therebetween so that the working efficiency of the vacuuming procedure can be enhanced.

Yet still another object of the invention is to provide a manufacturing method of a printing plate using a liquid photopolymer sachet, which can be freely sealed and freely quantified, and an apparatus using the same. When a plastic film is provided to cover an upper surface of the transparent sachet so that airtight upper and lower airtight spaces are respectively formed between the plastic film and both the upper and lower transparent clamping plates, the vacuuming procedures of the upper and lower airtight spaces may be performed when the upper and lower transparent clamping plates are to be pressed against each other so that the manufacturing processes can be simplified and the working efficiency can be enhanced. Also, because the plastic film is a transparent film, it cannot influence the transmission of the light source for the exposure procedure. Thus, it is unnecessary to remove the plastic film when the exposure procedure is being performed.

Yet still another object of the invention is to provide a manufacturing method of a printing plate using a liquid photopolymer sachet, which can be freely sealed and freely quantified, and an apparatus using the same. Upper and lower transparent clamping plates may be disposed on the same machine base, an upper light source for a plate bottom exposure procedure may be disposed above the upper transparent clamping plate, and a lower light source for a negative film exposure procedure may be disposed below the lower transparent clamping plate so that the light rays of the upper and lower light sources for exposure may respectively or simultaneously perform the plate bottom exposure procedure and the negative film exposure procedure to the liquid photopolymer layer in the transparent sachet through the upper and lower transparent clamping plates. Thus, the manufacturing processes can be simplified and the working efficiency can be enhanced.

Yet still another object of the invention is to provide a manufacturing method of a printing plate using a liquid photopolymer sachet, which can be freely sealed and freely quantified, and an apparatus using the same. Various apparatuses to be used in conjunction with the manufacturing method include upper and lower transparent clamping plates, suction channels, an upper light source disposed above the upper transparent clamping plate and used for a plate bottom exposure procedure, a lower light source for a negative film exposure procedure disposed below the lower transparent clamping plate, and a transparent plastic film for air isolation. The structures may be disposed on the same machine base so that various operation flows, such as the vacuuming procedure, the pressing operation of the upper and lower transparent clamping plates, and the negative film or plate bottom exposure procedure, can be conveniently operated and performed, and the best plate making effect that the upper and lower parts are respectively or simultaneously vacuumed and exposed can be achieved.

Further aspects, objects, and desirable features of the invention will be better understood from the detailed description and drawings that follow in which various embodiments of the disclosed invention are illustrated by way of examples.

DETAILED DESCRIPTION OF THE PREFERRED EMBODIMENTS

The above-mentioned and other features and advantages of the invention will be described in detail with reference to the accompanying drawings.

As shown in FIGS. 4 to 7, the invention provides a manufacturing method of a printing plate using a liquid photopolymer sachet, which may be freely sealed and freely quantified, and an apparatus using the same. The embodiment includes the following steps and associated apparatuses.

First, a liquid photopolymer transparent sachet 20 is provided according to molding specifications of a to-be-manufactured printing plate, such as the length, width and thickness of the printing plate, or according to the dimensional size of a negative film 10 and an estimated thickness. The liquid photopolymer transparent sachet 20 includes a transparent sachet 21 and a liquid photopolymer 22 accommodated therein. The shape of the transparent sachet 21 is not particularly restricted. The user can prepare the transparent sachet 21 using a sealing machine or tape to freely seal two plastic film sheets 21a according to the requirements in the length, width and height of the printing plate. In addition, at least one side of four peripheral sides of the transparent sachet 21 is not sealed so that an opening end 23 is formed. Herein, the so-called "free-seal" is due to that the conventional liquid photopolymer sachet (B1) is a liquid photopolymer sachet having four peripheral sides completely sealed. So, its dimensional sizes have been restricted, and the user only can choose a suitable sachet having the fixed sizes and cannot choose the sizes of the transparent sachet 21 according to the requirements, such as the molding specifications of the printing plate or the dimensional sizes of the negative film 10. Thus, the transparent sachet 21 cannot be freely sealed to form any shape so that the opening end 23 cannot be formed. Also, the user can freely quantify the liquid photopolymer 22 to be put into the transparent sachet 21 from the opening end 23 of the transparent sachet 21 so as to form the liquid photopolymer transparent sachet 20. Herein, the so-called "free-quantity" is due to that the conventional liquid photopolymer sachet (B1) is a liquid photopolymer sachet having four peripheral sides completely sealed. Thus, the liquid photopolymer has been packaged in a quantified manner and the quantity of the liquid photopolymer cannot be freely determined. Therefore, the user only can choose a suitable sachet, and cannot freely decide the total quantity of the liquid photopolymer 22 to be put into the transparent sachet 21 according to the molding specifications (the length, the width and especially the thickness) of the printing plate. Consequently, the invention is entitled "Manufacturing Method Of Printing Plate Using Free-Seal And Free-Quantity Liquid Photopolymer Sachet And Apparatus Using The Same", wherein the liquid photopolymer sachet, which can be freely sealed and freely quantified, is directed to the liquid photopolymer transparent sachet 20. Also, the input quantity of the liquid photopolymer 22 in the transparent sachet 21 may be greater than the estimated quantity of the printing plate.

Figure 5:
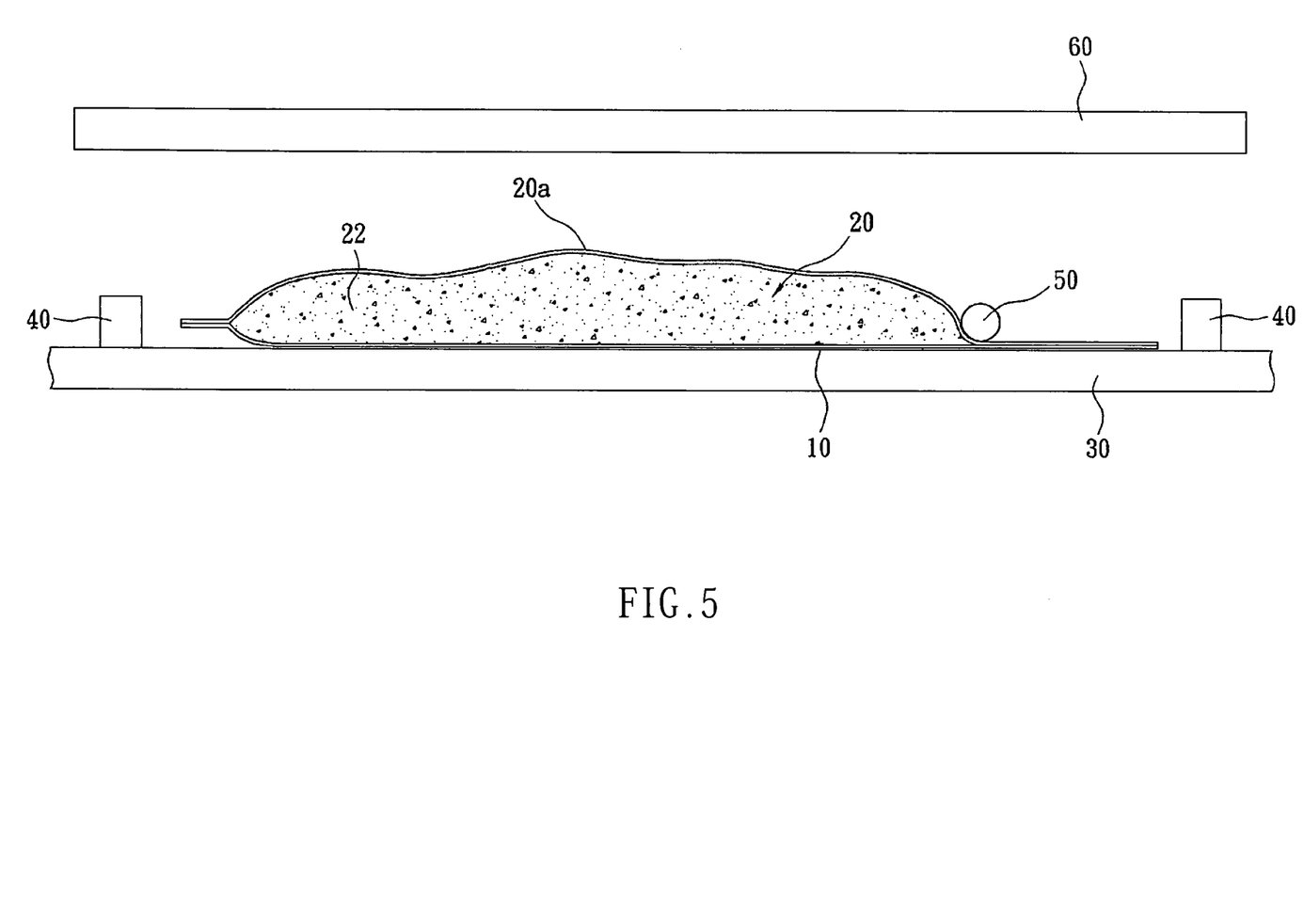
FIG. 5 is a side surface cross-sectional view showing an embodiment of the invention, in which the negative film is placed below the transparent sachet, and an upper transparent clamping plate and a lower transparent clamping plate are not pressed against each other.
Figure 6:
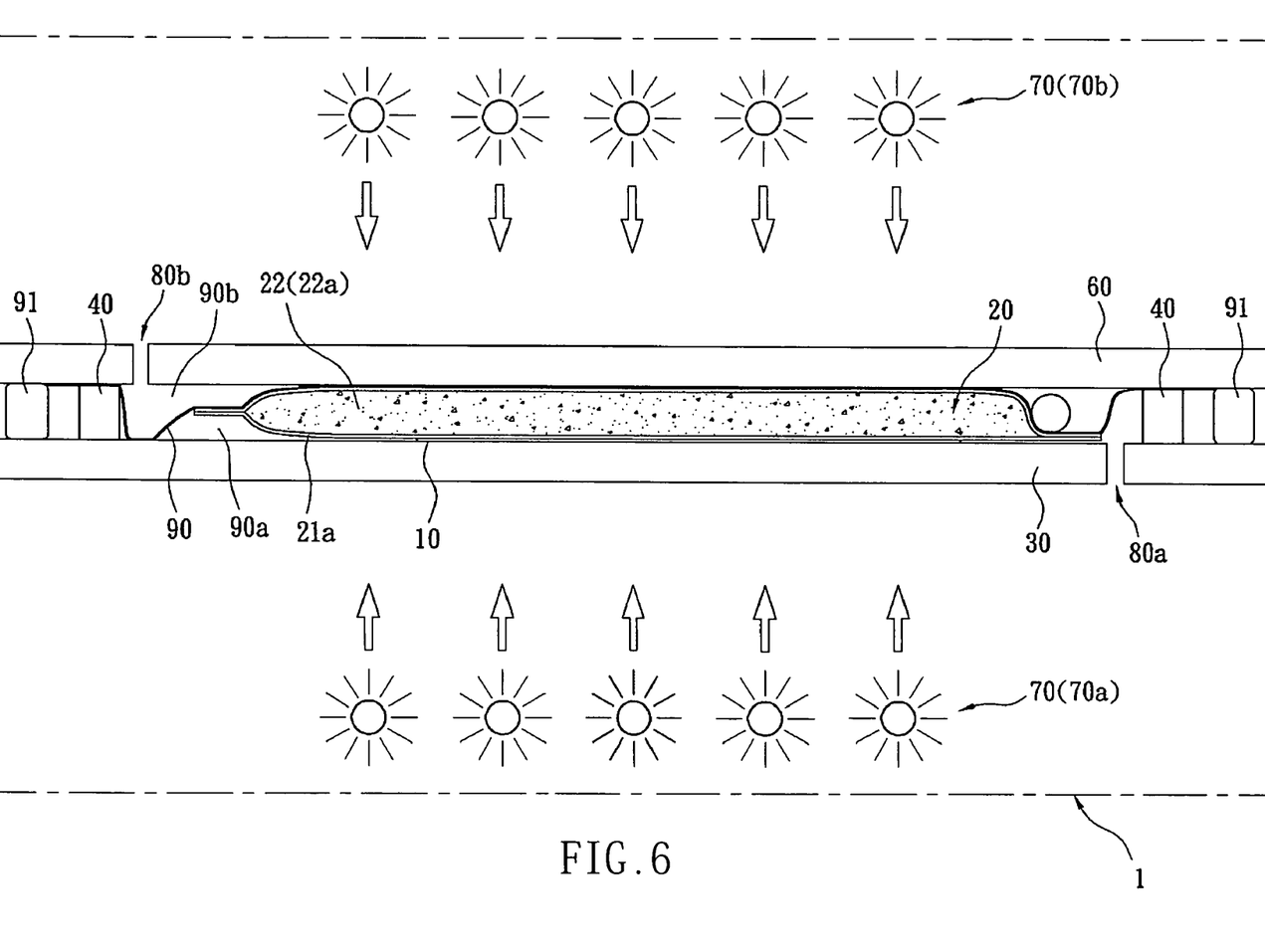
FIG. 6 is a side surface cross-sectional view showing an embodiment of the invention, in which the negative film is placed below the transparent sachet, and the upper clamping plate and the lower transparent clamping plate have been pressed against each other.
Figure 6A:
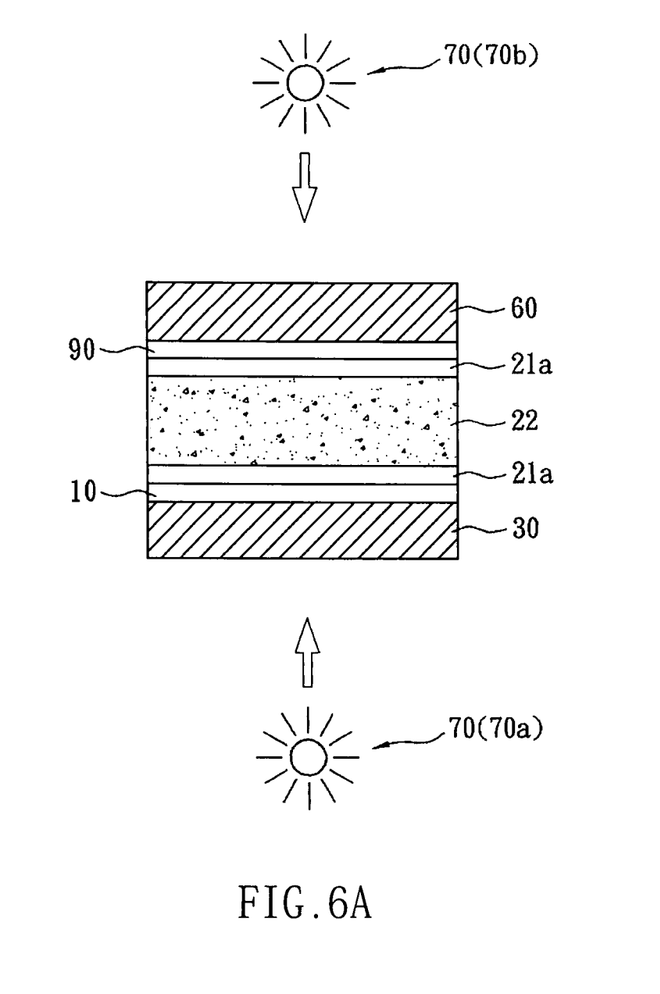
FIG. 6A is a schematically cross-sectional view showing positions of the upper and lower transparent clamping plates, upper and lower light source devices for the exposure procedure, the plastic film, the liquid photopolymer transparent sachet and the negative film according to the embodiment of FIG. 6, in which the negative film is placed below the transparent sachet.
Figure 7:
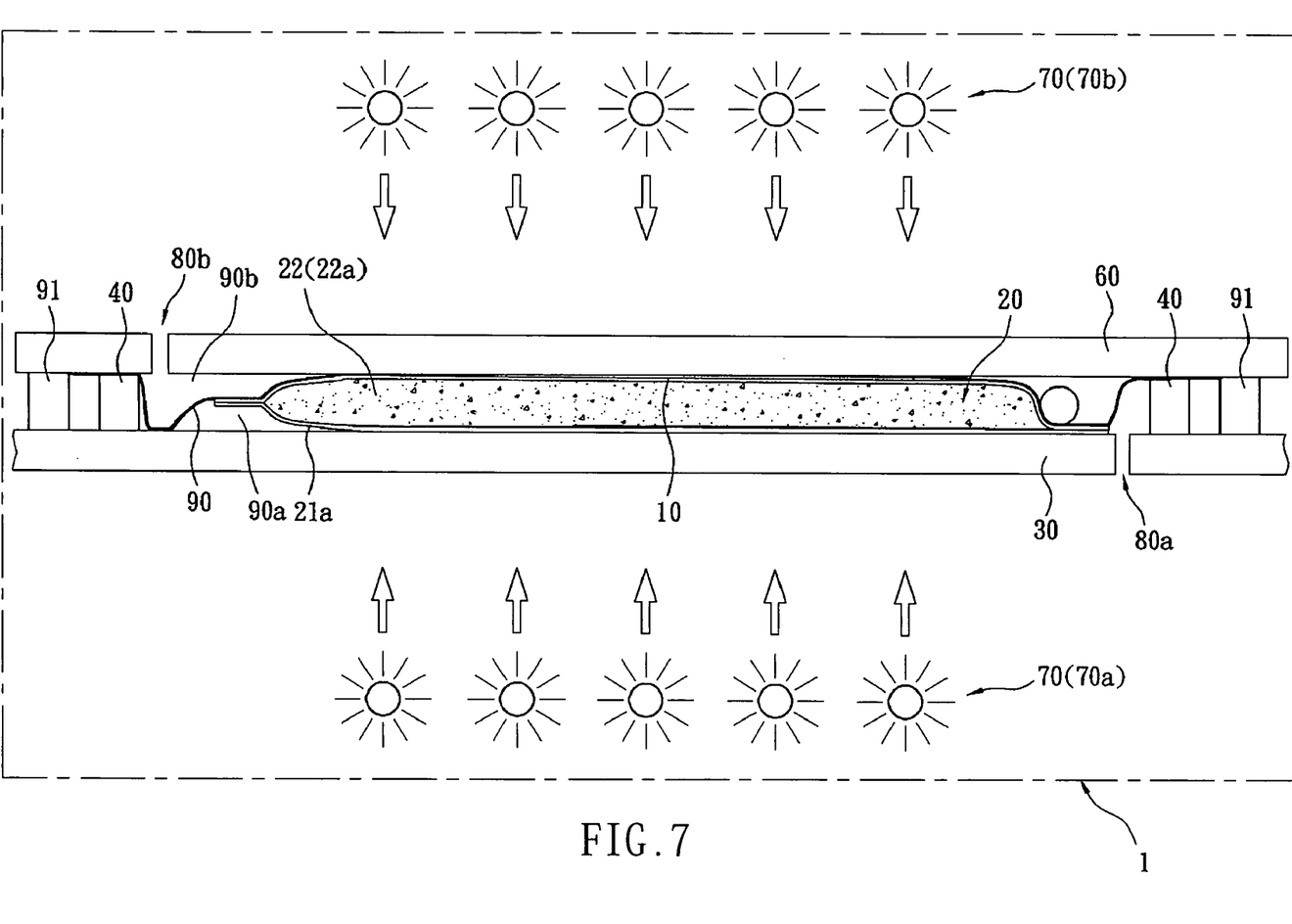
FIG. 7 is a side surface cross-sectional view showing another embodiment of the invention, in which the negative film is placed above the transparent sachet, and the upper clamping plate and the lower transparent clamping plate have been pressed against each other.
Figure 7A:
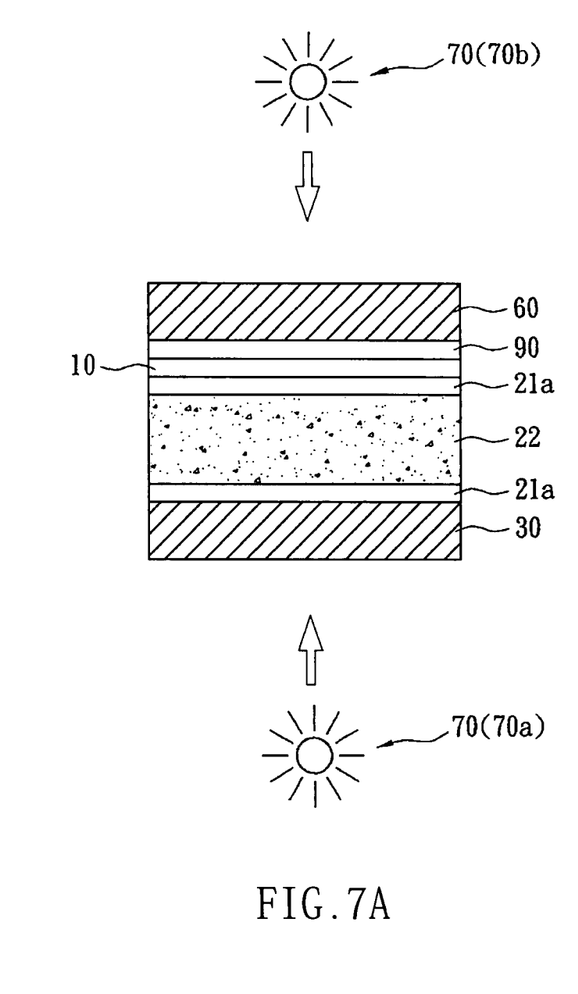
FIG. 7A is a schematically cross-sectional view showing positions of the upper and lower transparent clamping plates, upper and lower light source devices for the exposure procedure, the plastic film, the liquid photopolymer transparent sachet and the negative film according to the embodiment of FIG. 7, in which the negative film is placed above the transparent sachet.

Then, the liquid photopolymer transparent sachet 20 is evenly placed on a lower transparent clamping plate 30. In this embodiment, as shown in FIGS. 4, 5, 6 and 6A, the negative film 10 for plate making is interposed between the liquid photopolymer transparent sachet 20 and the lower transparent clamping plate 30. That is, the negative film 10 is disposed below the liquid photopolymer transparent sachet 20. However, the negative film 10 may also be disposed above the liquid photopolymer transparent sachet 20, as shown in FIGS. 7 and 7A.

Figure 4:
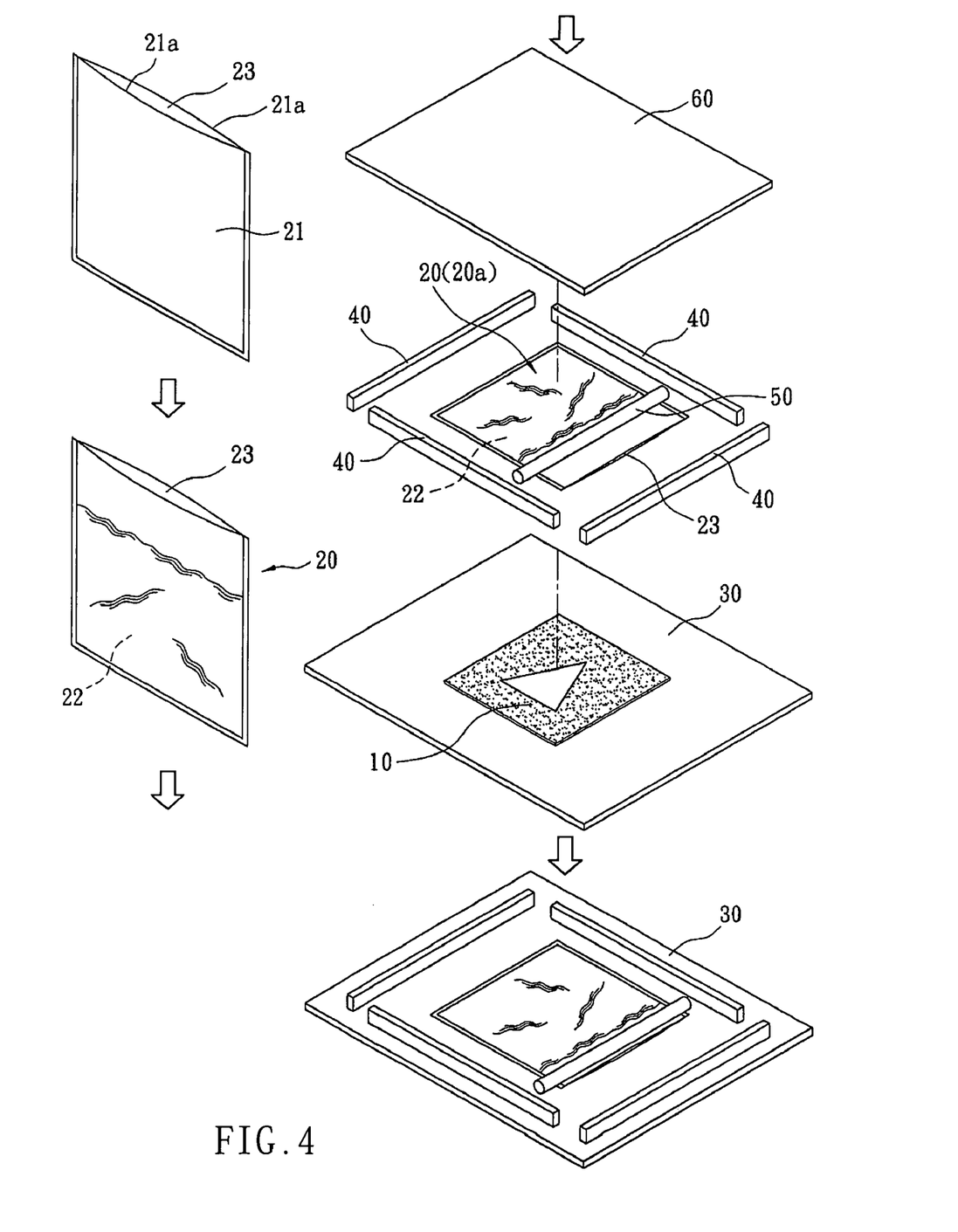
FIG. 4 is a pictorial view showing a manufacturing process and the associated apparatuses of the invention, in which a negative film is placed below a transparent sachet, according to an embodiment of the invention.

Next, four thickness gauges 40 are disposed around the liquid photopolymer transparent sachet 20. As shown in FIG. 4, the four thickness gauges 40 are respectively disposed on the four peripheral sides of the liquid photopolymer sachet 20. The thickness of the thickness gauge 40 is equal to a sum of a predetermined thickness of the molded printing plate, the thickness of two layers of the sachet sheets of the transparent sachet 21 (i.e., two plastic film sheets 21*a*), and the thickness of the negative film.

Then, at least one thrust rod 50 capable of freely rolling or sliding is provided. The thrust rod 50 may be a circular rod or have any other shape, and the diameter or height of the thrust rod 50 is smaller than the thickness of the thickness gauge 40. When the upper and lower transparent clamping plates are pressed against each other, the thrust rod 50 is placed in parallel to the side and placed at a position distant from the opening end 23 of the liquid photopolymer sachet 20, which is not sealed, by a distance. Thus, a stop end, which is movable relative to the liquid photopolymer 22 contained in the liquid photopolymer transparent sachet 20, is formed. That is, the liquid photopolymer 22 contained in the liquid photopolymer sachet 20 is pushed away from the opening end 23 toward the sealed side of the sachet and is temporarily stopped to prevent it from flowing to the side of the opening end 23 that is not sealed. Thus, the liquid photopolymer transparent sachet 20 containing the liquid photopolymer 22 therein is correspondingly formed with a bump 20*a*, wherein the height of the bump 20*a* may be higher than the thickness gage 40, as shown in FIGS. 4 and 5.

Next, an upper transparent clamping plate 60 is used to press against the lower transparent clamping plate 30 and thus to flatten the liquid photopolymer transparent sachet 20 so that the sachet 20 has the thickness the same as the thickness of the thickness gage 40 around the sachet 20. During the flattening procedure, the liquid photopolymer 22 contained in the sachet and higher than the bump 20*a* of the thickness gauge 40 is forced to flow to the opening end 23 on the side that is not sealed, and the flow of the liquid photopolymer 22 can simultaneously push the thrust rod 50 outward until it naturally stops, as shown in FIGS. 4 and 6. At this time, the liquid photopolymer 22 contained in the liquid photopolymer transparent sachet 20 can face the negative film and thus form a uniform liquid photopolymer layer (22), which has the predetermined thickness, to serve as the body of the printing plate. As shown in FIGS. 6 and 6A, the liquid photopolymer 22 is disposed above the negative film 10. As shown in FIGS. 7 and 7A, the liquid photopolymer 22 is disposed below the negative film 10.

Then, a light source device 70 is provided to perform the subsequent exposure and hardening operations, as shown in FIG. 6. The exposure procedure includes a negative film exposure procedure and a plate bottom exposure procedure. When the negative film 10 for plate making is interposed between the liquid photopolymer transparent sachet 20 and the lower transparent clamping plate 30 (i.e., disposed below the liquid photopolymer transparent sachet 20), as shown in FIGS. 6 and 6A, the light source device 70(70*a*) for the negative film exposure procedure is disposed below the lower transparent clamping plate 30 so that the negative film exposure procedure can be performed. The light source device 70(70*b*) for the plate bottom exposure procedure is disposed above the upper transparent clamping plate 60 so that the plate bottom exposure procedure can be performed. When the negative film 10 for plate making is placed above the liquid photopolymer transparent sachet 20, as shown in FIGS. 7 and 7A, the light source device 70 disposed below the lower transparent clamping plate 30 is changed to the light source device for the plate bottom exposure procedure, and the light source device 70 disposed above the upper transparent clamping plate 60 is changed to the light source device for the negative film exposure procedure so that the negative film exposure procedure can be performed. Thus, the light rays of the light source for the lower exposure and the upper exposure can respectively or simultaneously perform the negative film exposure procedure and the plate bottom exposure procedure on the liquid photopolymer layer (22) in the liquid photopolymer transparent sachet 20 through the lower and upper transparent clamping plates 30 and 60.

Then, after the exposure and hardening procedures are completed, the exposed printing plate body (22) is taken out of the liquid photopolymer transparent sachet 20 and then the printing plate is formed through the washing procedure.

As mentioned hereinabove, the manufacturing method of the printing plate and the apparatus using the same according to the invention can avoid the drawbacks caused when the printing plate is manufactured using the completely sealed and quantified liquid photopolymer sachet. In addition, the manufacturing processes of the printing plate and the plate making machine apparatus can be simplified. Thus, the apparatus cost and the manufacturing cost of the printing plate can be reduced, and it is advantageous to the enhancement of the working efficiency of the plate making.

In the manufacturing processes of the invention, when the liquid photopolymer transparent sachet 20 is evenly placed above the negative film 10, which is placed on the lower transparent clamping plate 30 in advance, that is, the negative film 10 is interposed between the liquid photopolymer transparent sachet 20 and the lower transparent clamping plate 30 (i.e., the negative film 10 is disposed below the liquid photopolymer transparent sachet 20), a suction channel can be provided to perform a vacuuming procedure through a lower vacuuming port 80*a* so that the liquid photopolymer sachet 20, the negative film 10 and the lower transparent clamping plate 30 may tightly contact with each other to prevent gaps from being formed therebetween and thus to enhance the image precision in the subsequent negative film exposure procedure. Because the suction channel and the lower vacuuming port 80*a* may be easily arranged by one of ordinary skill in the art, the detailed structures will be omitted.

Also, in the manufacturing processes of the invention, when the upper transparent clamping plate 60 and the lower transparent clamping plate 30 are evenly pressed against each other, another suction channel may be provided to perform another vacuuming procedure through an upper vacuuming port 80*b*. Thus, the upper transparent clamping plate 60 and the liquid photopolymer transparent sachet 20 may tightly contact with each other to prevent gaps from being formed therebetween and thus influencing the even effect of the plate being made. Also, a light source device 70*b*, which is disposed above the upper transparent clamping plate 60 and used for the plate bottom exposure procedure, is provided to perform the plate bottom exposure procedure so that the exposure and hardening procedures of the liquid photopolymer are completed. Because the suction channel 80 and the lower vacuuming port 80*a* may be easily arranged by one of ordinary skill in the art, the detailed structures will be omitted.

The manufacturing processes of the invention may further utilize a transparent plastic film 90 to cover over the liquid photopolymer transparent sachet 20 and thus to enhance the operation convenience. When the negative film 10 for plate making is interposed between the liquid photopolymer transparent sachet 20 and the lower transparent clamping plate 30 (i.e., disposed below the liquid photopolymer transparent sachet 20), the transparent plastic film 90 covers over the liquid photopolymer transparent sachet 20, as shown in FIGS. 6 and 6A. When the negative film 10 for plate making lies on the upper surface of the liquid photopolymer transparent sachet 20, the transparent plastic film 90 covers over the negative film 10 of the liquid photopolymer transparent sachet 20, as shown in FIGS. 7 and 7A. Thus, the plastic film 90 is interposed between the upper transparent clamping plate 60 and the lower transparent clamping plate 30 and has the function of air isolation so that lower and upper airtight spaces 90a and 90b are respectively formed between the plastic film 90 and both the lower transparent clamping plate 30 and the upper transparent clamping plate 60, as shown in FIGS. 6 and 7. When the lower and upper airtight spaces 90a and 90b are being respectively vacuumed using the suction channels through the lower and upper vacuuming ports 80a and 80b, the upper and lower transparent clamping plates 60 and 30 can be tightly contact with the liquid photopolymer transparent sachet 20 and the negative film 10 interposed therebetween to prevent the gaps from being formed so that the working efficiency of the vacuuming procedure can be enhanced. As shown in FIGS. 6 and 7, a leakage protection ring 91 may be disposed at the periphery of the plastic film 90 so that the airtight effect of the upper and lower airtight spaces formed by the plastic film 90 may be enhanced.

Also, in the manufacturing processes when the transparent plastic film 90 is provided to cover over the liquid photopolymer transparent sachet 20 so that the lower and upper airtight spaces 90a and 90b are formed between the plastic film 90 and both the upper and lower transparent clamping plates 60 and 30, the vacuuming procedures of the lower and upper airtight spaces 90a and 90b may be separately or simultaneously performed. That is, the vacuuming procedures may be formed while the upper and lower transparent clamping plates 60 and 30 are to be pressed against each other simultaneously so that the manufacturing processes can be simplified and the working efficiency can be enhanced. Also, because the plastic film 90 is a transparent film, it cannot influence the transmission of the light source of the exposure procedure. Therefore, it is unnecessary to remove the plastic film 90 when the exposure procedure is being performed.

Among various apparatuses to be used in conjunction with the manufacturing method of the invention, the upper and lower transparent clamping plates 60 and 30 may be disposed on the same machine base 1, as shown in FIGS. 6 and 7. In addition, the upper light source device 70b for the plate bottom exposure procedure is disposed above the upper transparent clamping plate 60, and the lower light source device 70a for the film exposure procedure is disposed below the lower transparent clamping plate 30. Thus, the light rays of the upper and lower light sources for the upper exposure and the lower exposure can respectively or simultaneously perform the plate bottom exposure procedure and the negative film exposure procedure on the liquid photopolymer layer, which is flattened and has the uniform thickness and accommodated within the liquid photopolymer transparent sachet 20 respectively through the upper and lower transparent clamping plates 60 and 30 so that the manufacturing processes can be simplified and the working efficiency can be enhanced.

Also, various apparatuses, which are used in conjunction with the manufacturing method of the invention and include the upper and lower transparent clamping plates 60 and 30, the suction channels, the lower light source device 70a for the negative film exposure procedure below the lower transparent clamping plate 30, the upper light source device 70b for the plate bottom exposure procedure above the upper transparent clamping plate 60, and the air-isolating transparent plastic film 90, can be disposed on the same machine base, as shown in FIGS. 6 and 7. That is, the lower transparent clamping plate 30 is disposed on the machine base and is used as the working surface, and the light source device 70a for the negative film exposure procedure is disposed below the lower transparent clamping plate 30 (i.e., below the machine base). Thus, the light rays of the light source device 70a can perform the negative film exposure procedure on the liquid photopolymer 22 in the liquid photopolymer transparent sachet 20 through the lower transparent clamping plate 30. Furthermore, the upper transparent clamping plate 60, the upper light source device 70b, the upper suction channel, the lower transparent clamping plate 30, the lower light source device 70a and the lower suction channel are disposed on the same machine base so that the convenience in use can be enhanced and the upper and lower exposure procedures of the plate bottom and the negative film can be performed without turning over. Thus, various operation flows, such as the vacuuming procedure, the procedure of pressing the upper and lower transparent clamping plates against each other, and the negative film or plate bottom exposure procedure can be conveniently performed so that the upper and lower portions can be respectively or simultaneously vacuumed or exposed and the plate making effect can be optimized.

New characteristics and advantages of the invention covered by this document have been set forth in the foregoing description. It is to be expressly understood, however, that the drawings are for the purpose of illustration only and are not intended as a definition of the limits of the invention. Changes in methods, shapes, structures or devices may be made in details without exceeding the scope of the invention by those who are skilled in the art. The scope of the invention is, of course, defined in the language in which the appended claims are expressed.

What is claimed is:
1. A method of manufacturing a printing plate, the method comprising the steps of:
providing at least one transparent sachet having one side, which is not sealed, according to a molding specification requirement of the printing plate;
pouring a liquid photopolymer into the transparent sachet to form a liquid photopolymer transparent sachet, wherein a free input quantity of the liquid photopolymer may be greater than an estimated quantity of the printing plate;
providing a lower transparent clamping plate;
evenly placing the liquid photopolymer transparent sachet onto the lower transparent clamping plate, wherein a negative film for plate making is to be placed below the liquid photopolymer transparent sachet such that the negative film is interposed between the liquid photopolymer transparent sachet and the lower transparent clamping plate, or the negative film for plate making is to be placed above the liquid photopolymer transparent sachet;
disposing thickness gauges around the transparent sachet, wherein a thickness of each of the thickness gauges is equal to a sum of a predetermined thickness of the printing plate, a thickness of two layers of the transparent sachet and a thickness of the negative film;
providing at least one thrust rod, which can roll or slide freely and has a diameter or height smaller than the thickness of the thickness gauge, to press against the liquid photopolymer transparent sachet in parallel to the side, which is not sealed, at a position distant from the side, which is not sealed, by a distance such that a stop end, which is movable relative to the liquid photopolymer contained in the liquid photopolymer transparent sachet, is formed to temporarily stop the liquid photopolymer so that the liquid photopolymer contained in the liquid photopolymer transparent sachet is higher than the thickness gauge to prevent the liquid photopolymer from flowing to the side of the liquid photopolymer transparent sachet, which is not sealed;

providing an upper transparent clamping plate to press against the lower transparent clamping plate evenly and thus to flatten the liquid photopolymer transparent sachet to a thickness the same as the thickness of the thickness gauge, wherein the liquid photopolymer, which is contained in the liquid photopolymer transparent sachet and higher than the thickness gauge, can freely flow to the side, which is not sealed, during the flattening and push the thrust rod outwards until the thrust rod is stopped naturally so that the liquid photopolymer contained in the liquid photopolymer transparent sachet is formed into a uniform liquid photopolymer layer, which has a predetermined thickness and serves as a printing plate body for exposure and hardening procedures according to a size of the negative film;

taking an exposed printing plate body out of the transparent sachet after the exposure and hardening procedures are finished; and performing a washing procedure to finish the printing plate.

2. The method according to claim 1, wherein when the liquid photopolymer transparent sachet is evenly placed on the lower transparent clamping plate and the negative film is placed above or below the liquid photopolymer transparent sachet, a vacuuming procedure is performed using suction channels so that the liquid photopolymer transparent sachet, the negative film and the lower transparent clamping plate can tightly contact with each other to prevent gaps from being formed therebetween and thus to enhance image precision in a subsequent negative film exposure procedure.

3. The method according to claim 2, wherein a transparent plastic film is to be disposed between the upper transparent clamping plate and the lower transparent clamping plate to separate the upper and lower transparent clamping plates from each other so that upper and lower airtight spaces are formed between the plastic film and the lower transparent clamping plate and between the plastic film and the upper transparent clamping plate so that the suction channels can perform the vacuuming procedures to the upper and lower airtight spaces, respectively.

4. The method according to claim 3, wherein the vacuuming procedures of the upper and lower airtight spaces may be performed simultaneously when the upper and lower transparent clamping plates are to be pressed together.

5. The method according to claim 1, wherein when the upper transparent clamping plate evenly presses against the lower transparent clamping plate, suction channels are provided to perform a vacuuming procedure so that the upper transparent clamping plate and the liquid photopolymer transparent sachet can tightly contact with each other to prevent gaps from being formed therebetween and from influencing an even effect of the plate making.

6. The method according to claim 5, wherein a transparent plastic film is to be disposed between the upper transparent clamping plate and the lower transparent clamping plate to separate the upper and lower transparent clamping plates from each other so that upper and lower airtight spaces are formed between the plastic film and the lower transparent clamping plate and between the plastic film and the upper transparent clamping plate so that the suction channels can perform the vacuuming procedures to the upper and lower airtight spaces, respectively.

7. The method according to claim 1, wherein the thrust rod is a circular rod, a rectangular rod or an angled rod.

8. The method according to claim 1, wherein:

the exposure procedure comprises a negative film exposure procedure and a plate bottom exposure procedure; and when the negative film for plate making is disposed below the liquid photopolymer transparent sachet, a light source device for the negative film exposure procedure is disposed below the lower transparent clamping plate so that light rays firstly pass through the negative film and then transmit through the liquid photopolymer contained in the liquid photopolymer transparent sachet and the negative film exposure and hardening procedures are performed, and a light source device for the plate bottom exposure procedure is disposed above the upper transparent clamping plate so that light rays are projected onto the liquid photopolymer contained in the liquid photopolymer transparent sachet to perform the plate bottom exposure procedure.

9. The method according to claim 1, wherein:

the exposure procedure comprises a negative film exposure procedure and a plate bottom exposure procedure; and when the negative film for plate making is disposed above the liquid photopolymer transparent sachet, a light source device for the negative film exposure procedure is disposed above the upper transparent clamping plate so that light rays firstly pass through the negative film and then transmit through the liquid photopolymer contained in the liquid photopolymer transparent sachet and the negative film exposure and hardening procedures are performed, and a light source device for the plate bottom exposure procedure is disposed below the lower transparent clamping plate so that light rays are projected onto the liquid photopolymer contained in the liquid photopolymer transparent sachet to perform the plate bottom exposure procedure.

10. An apparatus of manufacturing a printing plate, the apparatus comprising:

at least one transparent sachet having one side, which is not sealed;

a liquid photopolymer, which is to be poured into the transparent sachet in a freely quantified manner to form a liquid photopolymer transparent sachet;

a lower transparent clamping plate having an upper surface serving as a working surface, on which a negative film for plate printing and the liquid photopolymer transparent sachet, thickness gauges and at least one thrust rod is to be placed;

the thickness gauges, which are disposed on the upper surface of the lower transparent clamping plate and disposed around the liquid photopolymer transparent sachet;

the at least one thrust rod, which can roll or slide freely and has a diameter or a height smaller than a thickness of the thickness gauge, for pressing against the liquid photopolymer transparent sachet in parallel to the side, which is not sealed, at a position distant from the side, which is not sealed, by a distance such that a stop end, which is movable relative to the liquid photopolymer contained in the liquid photopolymer transparent sachet, is formed to temporarily stop the liquid photopolymer;

an upper transparent clamping plate for pressing against the lower transparent clamping plate evenly so as to flatten the liquid photopolymer transparent sachet to a thickness the same as the thickness of the gauge; and a light source device for outputting light rays to perform an exposure procedure.

11. The apparatus according to claim 10, further comprising at least one suction channel for performing a vacuuming procedure.

12. The apparatus according to claim 11, wherein the upper transparent clamping plate, the lower transparent clamping plate, the suction channel, and the light source device for the exposure procedure are disposed on the same machine.

13. The apparatus according to claim 10, wherein a transparent plastic film is to be disposed between the upper transparent clamping plate and the lower transparent clamping plate to separate the upper and lower transparent clamping plates from each other so that upper and lower airtight spaces are formed between the plastic film and the lower transparent clamping plate and between the plastic film and the upper transparent clamping plate so that suction channels can respectively or simultaneously perform vacuuming procedures to the upper and lower airtight spaces.

14. The apparatus according to claim 10, wherein the light source device for the exposure procedure includes a light source device for a negative film exposure procedure and a light source device for a plate bottom exposure procedure.

15. The apparatus according to claim 14, wherein the light source device for the negative film exposure procedure and the light source device for the plate bottom exposure procedure are respectively disposed below the lower transparent clamping plate and above the upper transparent clamping plate.

* * * * *